United States Patent
Chang et al.

(10) Patent No.: US 11,706,083 B1
(45) Date of Patent: Jul. 18, 2023

(54) TELCO-GRAD SERVER/ETHERNET NETWORK SWITCH

(71) Applicant: Opnet Technologies Co., Ltd., Hsinchu Country (TW)

(72) Inventors: Tsung-Shien Chang, Hsinchu Country (TW); Gwo-Liang Chen, Hsinchu Country (TW); Ching-Tang Wang, Hsinchu Country (TW)

(73) Assignee: Opnet Technologies Co., Ltd., Hsinchu County (TW)

( * ) Notice: Subject to any disclaimer, the term of this patent is extended or adjusted under 35 U.S.C. 154(b) by 0 days.

(21) Appl. No.: 17/650,527

(22) Filed: Feb. 10, 2022

(51) Int. Cl.
*H04L 41/0663* (2022.01)
*H05K 7/14* (2006.01)
*H04L 43/0817* (2022.01)

(52) U.S. Cl.
CPC ...... *H04L 41/0663* (2013.01); *H04L 43/0817* (2013.01); *H05K 7/1492* (2013.01)

(58) Field of Classification Search
CPC ............. H04L 41/0663; H04L 43/0817; H04L 12/413; H04L 12/6418; H04L 47/23; H04L 49/00; H04L 49/251; H04L 49/552; H04L 67/142; H05K 7/1492; G06F 1/26; G06F 11/004; H02J 7/02
See application file for complete search history.

(56) References Cited

U.S. PATENT DOCUMENTS

| | | | |
|---|---|---|---|
| 8,370,494 B1 * | 2/2013 | Chen ..................... | G06F 11/004 709/208 |
| 8,711,681 B2 | 4/2014 | Hu et al. | |
| 8,907,520 B2 | 12/2014 | Chapel et al. | |
| 9,716,616 B2 | 7/2017 | Li et al. | |
| 2008/0304477 A1 * | 12/2008 | Froroth ................. | H04L 49/552 370/360 |
| 2012/0243160 A1 * | 9/2012 | Nguyen ................... | G06F 1/26 361/679.08 |
| 2015/0229577 A1 * | 8/2015 | Baratam ............... | H04L 49/251 370/415 |
| 2016/0182450 A1 * | 6/2016 | Mihelich ............... | H04L 67/142 726/13 |
| 2017/0310538 A1 * | 10/2017 | Cai ........................ | H04L 12/413 |
| 2019/0149260 A1 * | 5/2019 | Cai ......................... | H04L 49/00 398/14 |
| 2020/0145742 A1 * | 5/2020 | Menard ............... | H04L 12/6418 |
| 2020/0235607 A1 * | 7/2020 | Kanarellis ................. | H02J 7/02 |
| 2021/0367869 A1 * | 11/2021 | Zhang ..................... | H04L 47/23 |
| 2022/0264759 A1 * | 8/2022 | Sawyer ................... | G06F 1/183 |

FOREIGN PATENT DOCUMENTS

| | | |
|---|---|---|
| TW | 200616468 A | 5/2006 |
| TW | M529207 U | 9/2016 |
| TW | I612429 B | 1/2018 |

* cited by examiner

*Primary Examiner* — Le H Luu
(74) *Attorney, Agent, or Firm* — CKC & Partners Co., LLC

(57) ABSTRACT

The telco-grade server/Ethernet network switch is the most compacted-size design with a 1.5 U or 2 U height chassis. A high-speed backplane to connect with all boards, including server/Ethernet switch board, LAN port interface board, power supply board, management board and fan module board and hot-swappable feature supported. Two equal switches are accommodated within chassis to perform two independent switches or one switch with telco-grade to meet high reliability request, such as 99.999% reliability.

9 Claims, 8 Drawing Sheets

TELCO-GRAD SERVER/ETHERNET NETWORK SWITCH

BACKGROUND OF THE INVENTION

Field of Invention

The present invention relates to a telco-grade Server/Ethernet Network Switch, especially within a 1.5 U/2 U high chassis, 2 Server/Ethernet Switches which connected through a high-speed back plane are accommodated together. This can be configured as 2 independent Server/Ethernet Switches-A and Server/Ethernet Switch-B or a telco grade Server/Ethernet Network Switch, since with circuit protection design (including intra-connection between two server/switch boards and transmission path protection in the LAN interface board) and hot-swappable capability. This architecture is designed for the high reliability request network, especially the access network of the communication service provider (CSP) and mobile network operator (MNO).

Description of Related Art

At present, the network switch for the data service provider (DSP) is a mono-board design and equips with dual power units and couple fan modules. Once switch fabric or CPU or other hardware failed, the devices connect with its LAN port is disconnected. To provide the high availability redundant network, high-availability (or spine-leaf architecture) is used. At the end device, it needs 2 input ports to connect with different device output for high availability request.

Normally, the telecommunication system consists of 2 parts, Center Office (CO) and Customer Premise Equipment (CPE). To ensure CPE working without traffic service interruption, the CO needs to equip dual platforms with auto failover switch capability to meet 99.999% reliability requirement. Different from the switch/server installed in the center office of the DSP, the CSP's CO may be installed in the remote side, such as in build basement or road side cabinet which without maintained by the operator hired 24-hour/day.

Here GPON is a good for example:

GPON consists of OLT installed in the center office and ONU installed in the office or residential. To ensure ONU service without interruption, each OLT needs to link with one of 2 aggregation switches through a transmission path selector. Once one aggregation switch is failed, the OLT will be switched to another aggregation switch to avoid service interruption. Generally, the failed over switch time is about few millisecond. The telco grade server/Ethernet network switch is split into couple boards and connected together through a high-speed back plane. With hot-swappable, defect board can be replaced in the field without service interruption. With a high speed connection between server/Ethernet switches, this can be configured as telco grade server/Ethernet network switch to meet 99.999% reliability.

SUMMARY

According to an aspect of the present invention, the telco grade server/Ethernet network switch is composed of 2 server/Ethernet switches boards with LAN interface boards. According to the customer's request, telco-grade server/Ethernet network switch can be configured as two individual server/Ethernet switches or a telco grade server/Ethernet switch. In the telco grade mode, as one server/Ethernet switch board is failed, the associated LAN board will be switched to another server/Ethernet switch board without service interruption. After defected board be fixed and plug to cabinet, the critical and control message be synchronized with working service/Ethernet switch board, the switched LAN board will be switched back to original connection, and vice versa.

In one embodiment of the present application, the two Server/Ethernet switches are set as a telco-grade server/Ethernet network switch. The Server/Ethernet switch-A and Server/Ethernet Switch-B perform protection switching to each other. As Server/Ethernet Switch-A is failed, its LAN-A interface board is switched to Server/Ethernet Switch-B within few million second. If some ports of switch fabric of Server/Ethernet Switch-A are failed, then those ports will be switch to Server/Ethernet Switch-B. The transmission path of 10G/25G port is performance by timer/Mux buffer.

In summary, Server/Ethernet Switch-A and Server/Ethernet Switch-B in the telco-grade network switch has a control processor (in server) to monitor working condition at any time. If the control processor detects a hardware failure message in Server/Ethernet Switch-A or Server/Ethernet Switch-B or a failure alarm message generated by the switch fabric, due to a software problem, the control processor processes the failure message, makes arbitration and notifies to another control processor to enable Mux of LAN interface board to switch to Server/Ethernet Switch-B automatically.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

In order to make the above and other objects, features and advantages of the disclosure more comprehensible, several embodiments accompanied with figures are described in detail below.

DETAILED DESCRIPTION

Figure 1:
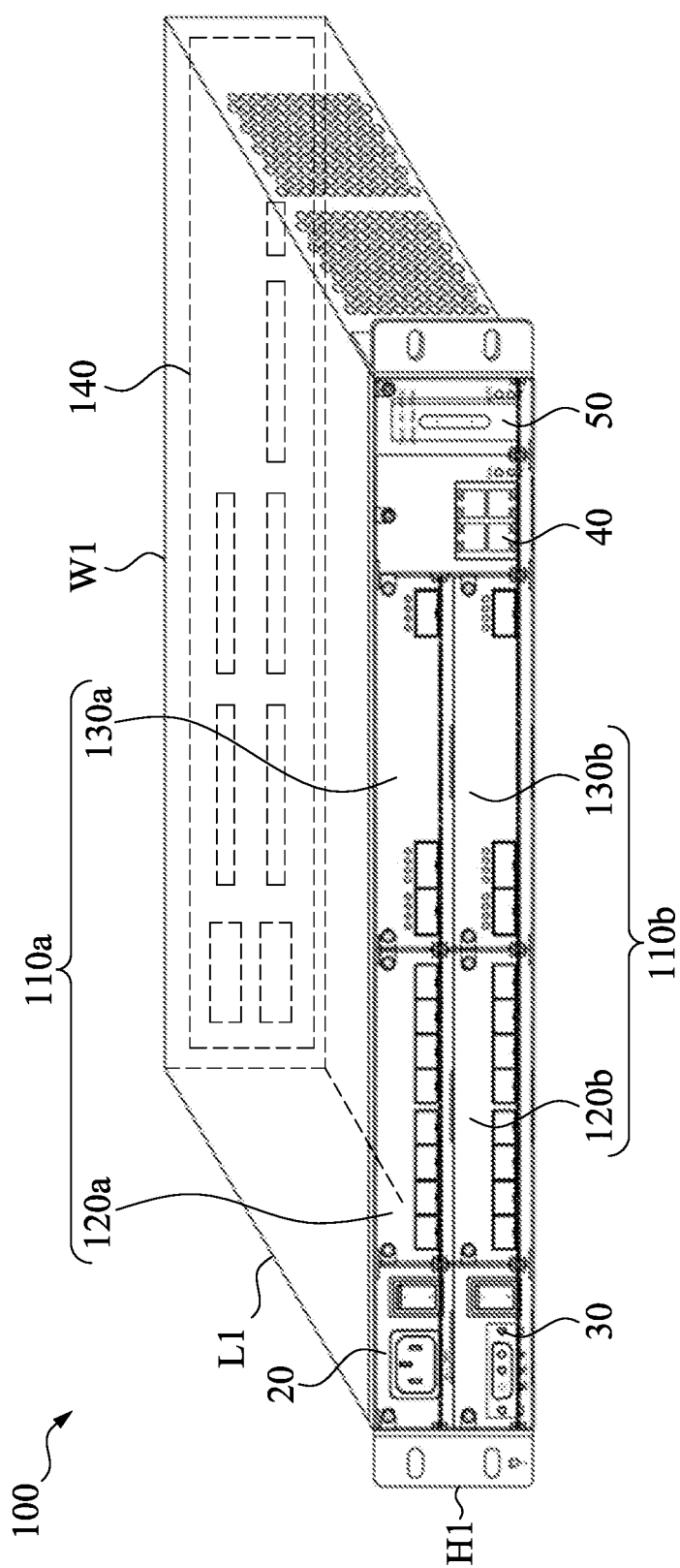
FIG. 1 illustrates a schematic diagram of a telco-grade server/Ethernet network switch 100 according to an embodiment of the present application.

Reference will now be made in detail to the present preferred embodiments of the disclosure, examples of which are illustrated in the accompanying drawings. Wherever possible, the same reference numbers are used in the drawings and the description to refer to the same or like parts.

To comprehensively describe the disclosure in detail, reference may be made to the accompanying drawings and various embodiments. Meanwhile, components and steps known by the public are not described in the embodiments to prevent unnecessary limitations from being imposed to the disclosure.

Terms such as "couple" or "connect" used in the embodiments may refer to two or more components being in physical or electrical contact with each other "directly", two or more components being in physical or electrical contact with each other "indirectly", or acting of two or more components with each other.

The foregoing and other technical content, features, and effects of the present invention can be clearly presented below in detailed descriptions of embodiments with reference to the drawings.

FIG. 1 illustrates a schematic diagram of telco-grade Server/Ethernet network switch 100 according to an embodiment of the present application. The telco-grade server/Ethernet network switch 100 is composed of a chassis with height H1, depth L1, and width W1. Total 8 slots in the chassis: an AC/DC power converter board 20, a DC/DC power converter board 30, a LAN-A port interface board 120a and server/Ethernet switch board 130a of server/Ethernet switch-A 110a, a LAN-B port interface board 120b and a server/Ethernet switch board 130b of server/Ethernet switch-B 110b, a network management and timing synchronization with IEEE1588v2 board 40, a fan module board 50 and a high-speed backplane 140. All the boards are connected with backplane, with hot-swappable, the defected board, including power converter board, LAN port interface, server/Ethernet switch board and fan module board can be replaced without service interruption.

In one embodiment, the height H1 is not excess 2 U, 3.5 inches or 88 mm. The depth L1 is not excess 15 inches or 380 mm. The width W1 is 19 inches or 48.2 mm. The power converter can be AC/DC and AC/DC, AC/DC and DC/DC, or DC/DC and DC/DC combination with current sharing.

Figure 2:
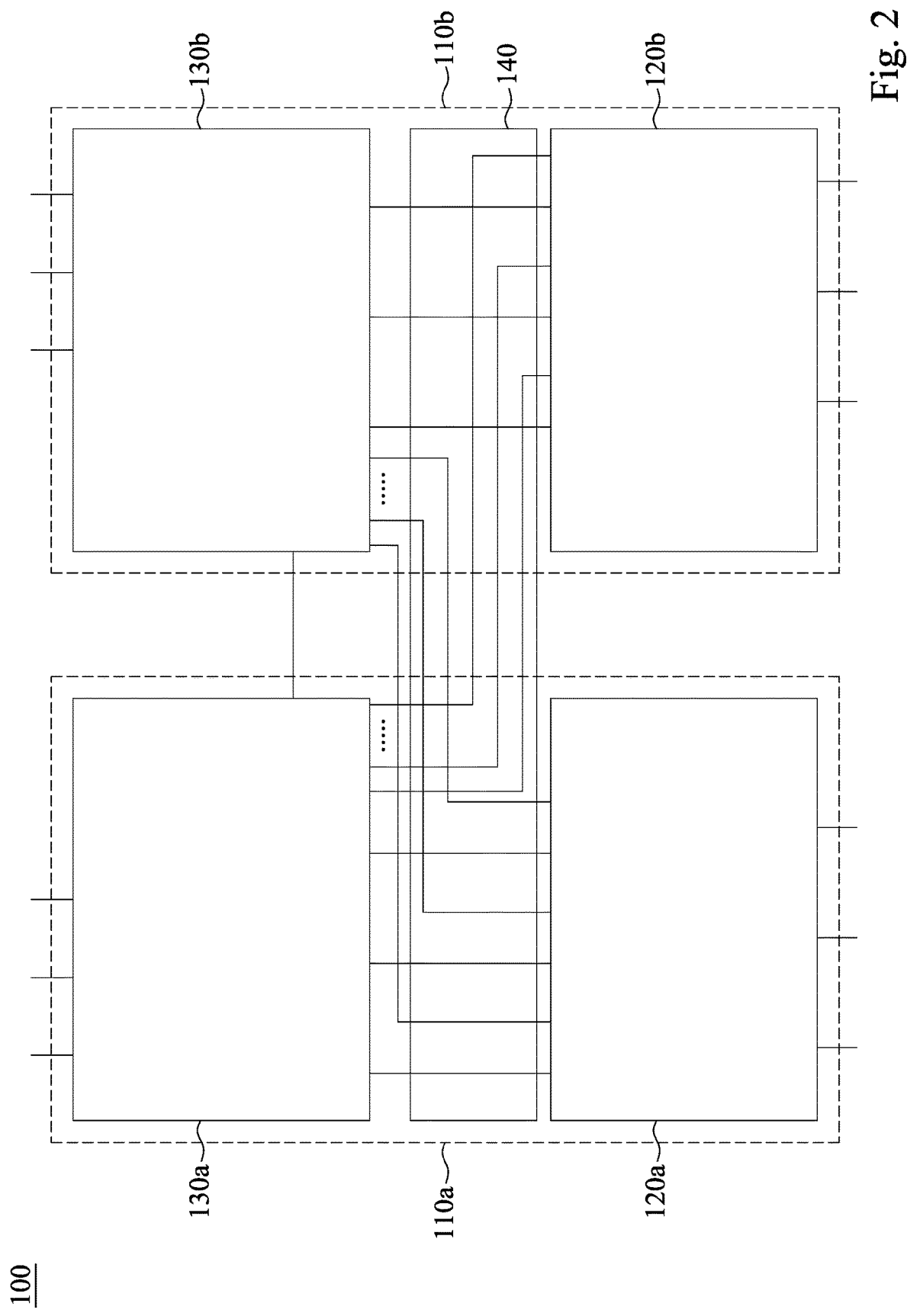
FIG. 2 illustrates a functional block diagram of a telco-grade server/Ethernet Network Switch 100 according to an embodiment of present application.

FIG. 2 illustrates a functional block diagram of a telco-grade server/Ethernet network switch according to an embodiment of the present application. The telco-grade server/Ethernet network switch 100 composes of server/Ethernet switch-A 110a and server/Ethernet switch-B 110b. While server/Ethernet switch-A consists of a LAN-A port interface board 120a, and server/Ethernet switch board 130a. The server/Ethernet switch-B consists of LAN-B port interface board 120b and server/Ethernet switch board 130b. Those above-mentioned boards are connected to each other boards through a high-speed backplane 140. The detailed operation will be described later.

Figure 3:
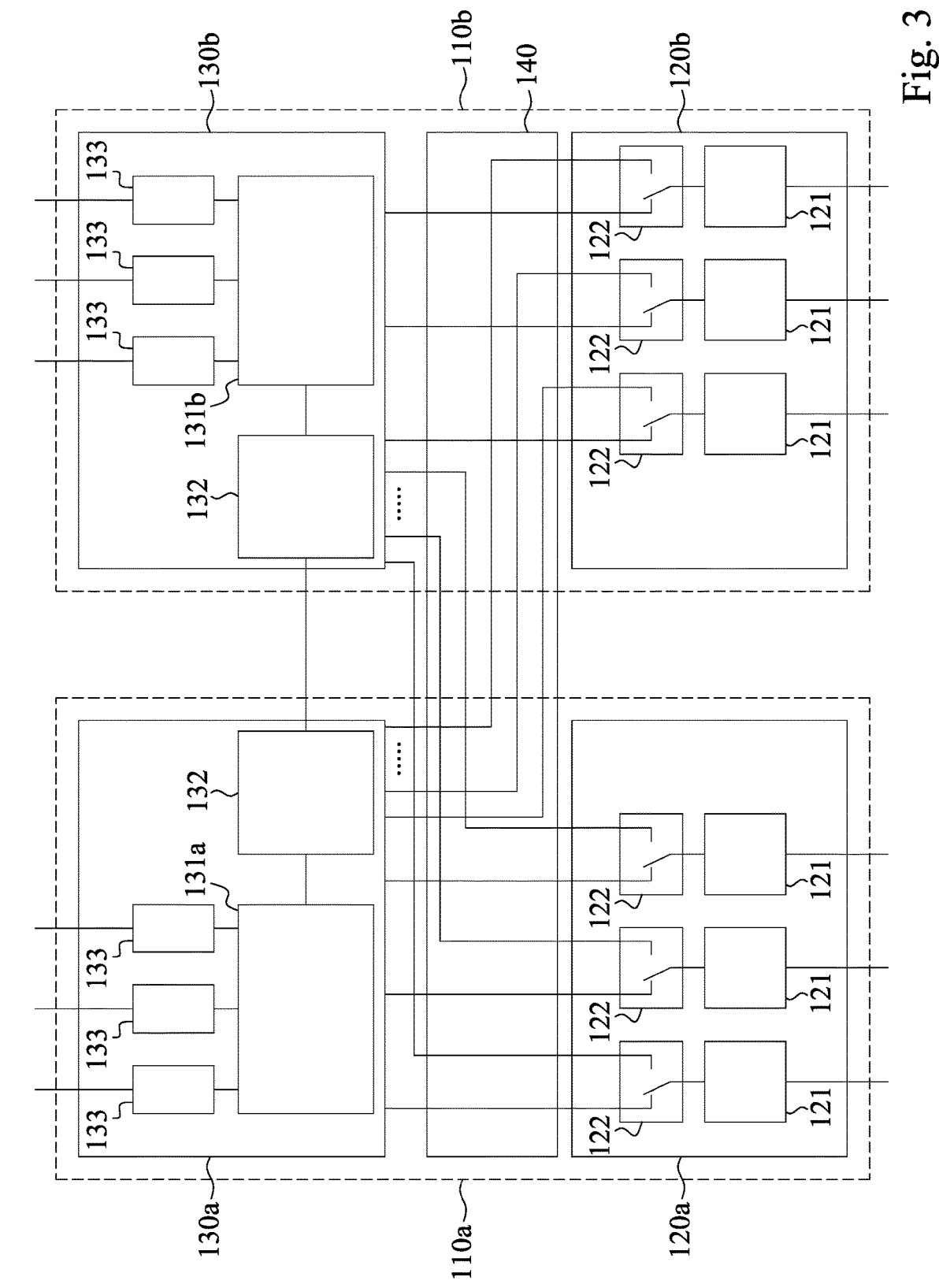
FIG. 3 illustrates a detailed functional block diagram of 2 independent Server/Ethernet Switches 110a and 110b according to an embodiment of the present application.

FIG. 3 illustrates a detailed functional block diagram of a telco-grade server/Ethernet network switch 100 according to an embodiment of the present application. The LAN-A port interface board 120a of server/Ethernet switch 110a and LAN-B port interface board 120b of the server/Ethernet switch 110b each includes a low-speed optical transceiver 121 and a transmission pater selector or Mux 122. For convenience of the description, only 6 sets of LAN optical transceivers 121 and transmission path selectors 122 are illustrated in FIG. 3. However, the number of set of LAN optical transceivers 121 and transmission path selectors 122 is not limited to this, and can be adjusted based on actual conditions.

The optical transceiver 121 of LAN-A&B port interface board is used to send and receive traffic by the speed of 10 Gb/25 Gb. The transmission path selector (Mux) 122 is connected with optical transceiver 121 and server/Ethernet-A switch board 130a or server/Ethernet switch-B board 130b through the high-speed backplane 140. For the downlink traffic, the transmission path selector 122 connects with either server/Ethernet switch-A board 130a or server/Ethernet switch-B board 130b according to the system controlling condition of the telco-grade server/Ethernet network switch 100. For the uplink traffic sent from the other equipment, the transmission path selector 122 sends received traffic to both server/Ethernet switch-A board 130a and server/Ethernet switch-B board 130b through high-speed backplane 140 simultaneously.

In one embodiment, the optical transceiver 121 of LAN port interface board 120a and 120b is a 10 Gb/25 Gb physical layer interface with IEEE1588v2 accrue timing synchronization function and multi-layer network protocol mode. At the same time the optical transceiver digital diagnostic monitor (DDM) can be read to controller by the I²C interface, those parameters include transceiver internal temperature, power supply voltage, TX optical power, TX bias current and RX optical power.

Server/Ethernet switch-A board 130a of server/Ethernet switch-A 110a and Server/Ethernet switch-B 130b of server/Ethernet switch-B 110b consists of 100G Ethernet switch fabric 131a or 131b, server (controller) module 132 and 100 Gb high speed optical transceiver 133. The data packet received from data network or other equipment through high-speed optical transceiver 133 is transmitted to Ethernet fabric 131a or 131b. The data packet is disassembled, processed and repackaged according to the IEEE standard requirement and send to the output port. Then repacked data is sent to the transmission selector 122 through the high-speed backplane 140, and finally sent to the other device through the optical transceiver 121 of the LAN port interface board 120a or 120b. On the other hand, the data packet received from other device through optical transceiver 121 of the LAN port interface board 120a or 120b, through the transmission path selector 122, and through high-speed backplane 140 and finally sent to 100G switch fabric 131a and 131b. The data packet is processed by the switch fabric 131a and 1311b, and sent to data network or other device through high-speed optical transceiver 133. The control message generated by the monitoring point in each hardware elements is connected with FPGA first, then link with server (CPU) 132. With communication between two servers (CPUs) 132, the control message and critical message cab be synchronized through 10G or PCIe connection.

In one embodiment, the Ethernet switch fabric 131a 131b can be 100 Gb or 400 Gb to process, exchange and transmit packet of traffic between high-speed optical transceiver 133 and LAN port interface board 120a and 120b. The switch fabric equips with switching function of network layer2 (Data Link Layer) and router function of network layer3 (Network Layer).

In one embodiment, the server (control processor) 132 is a central processing unit, a microprocessor, or other processors with computing, system management, monitoring, setting maintenance function. The server (control processor)

132 also has IEEE1588v2 1-step PTP (precision time protocol) calculation function. In one embodiment, the server (control processor) 132 is an Intel X86 series or ARM based processor. The server (control processor) 132 is also used to identify and execute the protection switching conditions of the telco-grade server/Ethernet network switch 100.

In one embodiment, the high-speed interface transceiver 133 is a 100 Gbps physical layer interface transceiver, which consists of 4 sets of 25 Gbps data streams to form 100 Gbps traffic, or 8 sets of 50 Gbps data streams to form 400 Gbps traffic. The high-speed interface transceiver 133 has IEEE 1588v2 precision Clock synchronization function and supports multi-layer network protocol operation mode.

FIG. 3 illustrates a schematic diagram of the operation of the telco-grade server/Ethernet network switch 100 according to an embodiment of the present application. In normal operation, there are 2 server/Ethernet switches 110a and 110b in service simultaneously. At the server Ethernet switch-A 110a, the received traffic is sent to switch fabric 131a through high-speed optical transceiver 133, finally sent to LAN port optical transceiver 121 through high-speed backplane 140 and transmission path selector 122. At the same time, at the server Ethernet switch-B 110b, the received traffic is sent to switch fabric 131b through high-speed optical transceiver 133, finally sent to LAN port optical transceiver 121 through high-speed backplane 140 and transmission path selector 122. The solid line between Ethernet switch fabric 131a and transmission path selector 122 of server/Ethernet switch-A 110a indicating the traffic service by server/Ethernet switch-A 110a. The dashed line between Ethernet switch fabric 131b and transmission path selector 122 of server/Ethernet switch-A 110a indicating the traffic server by server/Ethernet switch-B, this means that once server/Ethernet switch board 130a is fail, the LAN-A port interface board will be switched to other server/Ethernet switch-B 110b for traffic service without interruption. In contrast, The dashed line between Ethernet switch fabric 131 a and transmission path selector 122 of server/Ethernet switch-B indicating the traffic server by server/Ethernet switch-A, this means that once server/Ethernet switch board 130b is fail, the LAN-B port interface board will be switched to other server/Ethernet switch-A 110a for traffic service without interruption.

Figure 4:
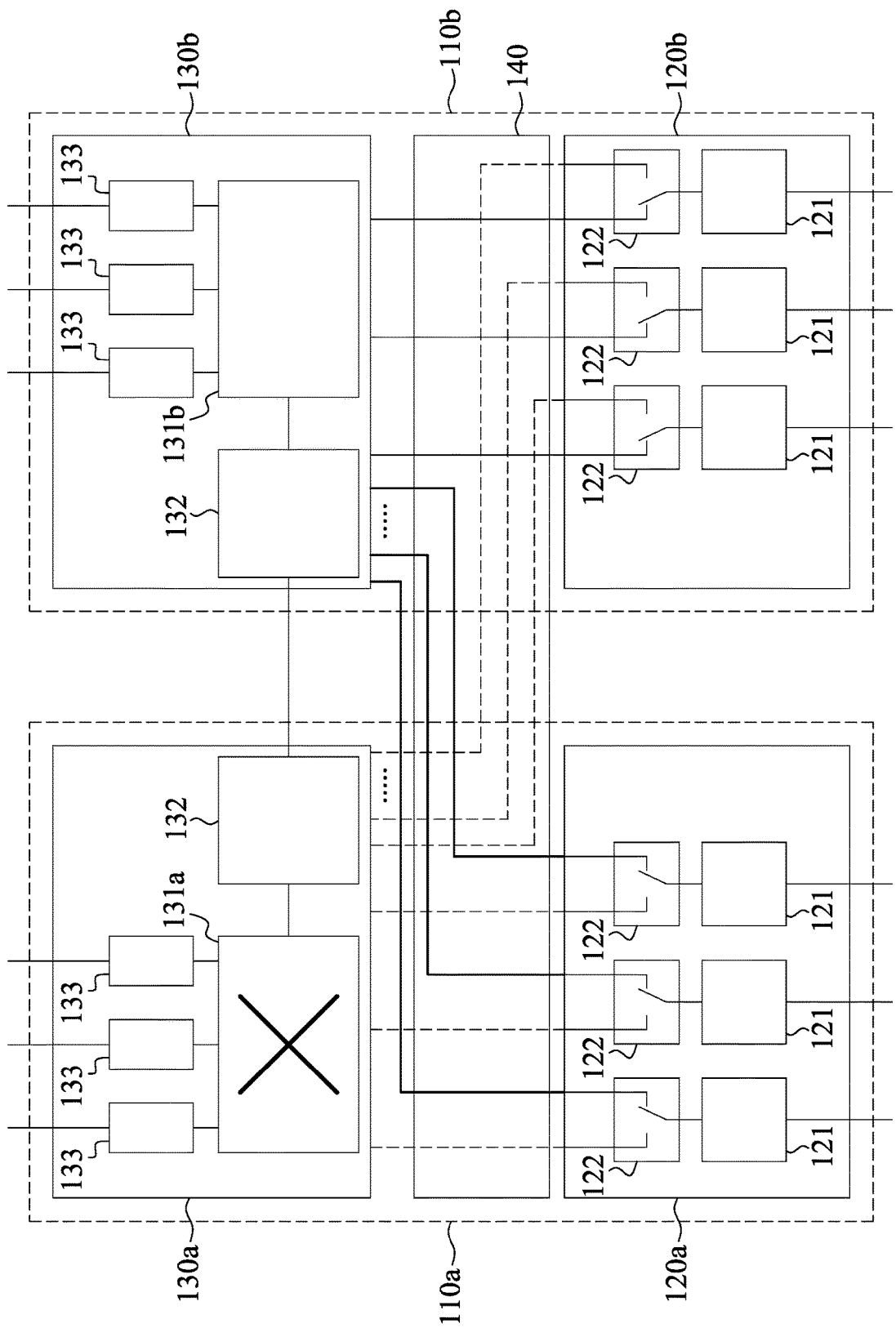
FIG. 4 illustrates a schematic diagram of the telco-grade server/Ethernet network switch as the one server/Ethernet switch 130a is failed and LAN-A port interface board 120a will be switched to another server/Ethernet switch 130b automatically.
Figure 5:
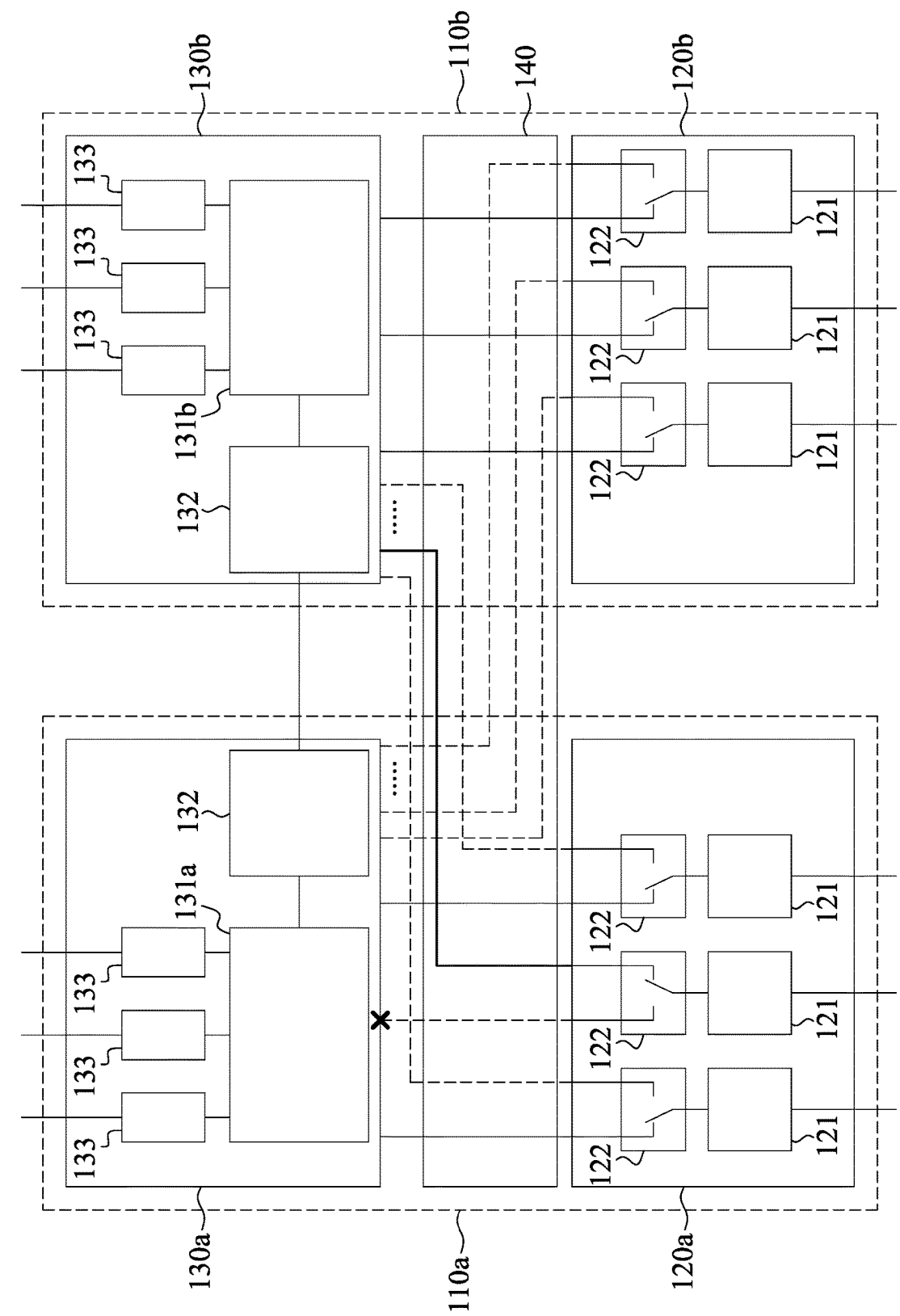
FIG. 5 illustrates a schematic diagram of the telco-grade server/Ethernet network schedule as one port of switch fabric 131a is failed, this port will be switched to another server/Ethernet switch board 130b automatically.

FIG. 4 illustrates a schematic diagram of the operation of the server/Ethernet switch-A and B boards 130a and 130b. Once server/Ethernet switch-A board 130a is fail, the LAN-A port interface board 120a will be switched to server/Ethernet switch-B board 130b by the transmission path selector 122 action. At the same way, if server/Ethernet switch-B board 130b is fail, the LAN-B port interface board 120b will be switch to server/Ethernet switch-A 130a by the transmission path selector 122 action. FIG. 5 is a schematic diagram of the operation of the telco-grade server/Ethernet network switch 100 according to an embodiment of the present application. In case of one port of Ethernet switch fabric 131a of server/Ethernet switch-A board 130a is fail, then associated optical transceiver 121 of LAN port interface board 120a will be switched to Ethernet switch fabric 131 of server/Ethernet switch-B 130b without service interruption. At the same way, in case of one port of Ethernet switch fabric 131b of server/Ethernet switch-B board 130b is fail, then associated optical transceiver 121 of LAN port interface board 120b will be switched to Ethernet switch fabric 131 of server/Ethernet switch-A 130a without service. Note that the number of defected port is not limited to one.

In one embodiment, server (control processor) 132 of the server/Ethernet switch-A board 130a is set as "master" control processor. Server (control processor) 132 of the server/Ethernet switch-B board 130b is set as "slave" control processor. Both control processors communicate to each other through a 10G or PCIe bus through high-speed backplane 140. The control message and critical message in both server/Ethernet switch-A board 130a and server/Ethernet switch-B board 130b are be synchronized through this connection. If server/Ethernet switch-A board is fail, LAN-A port interface board 120a will switched to server/Ethernet-B 130b, and control processor, 132 of server/Ethernet switch-A board 130b will be change to master to take over the hardware monitor and controlling. As server/Ethernet switch-A board 130a is replaced and back to normal, the message, including control and critical of server/Ethernet switch-B board 130b will download to server/Ethernet switch-A board 130a, through link between two control processor 132s, the control processor 132 of server/Ethernet switch-A 130a will be back to normal status and to be set "master" control processor, and enable transmission path selector 122 to enable LAN-A port interface board 120a to switch back to server/Ethernet switch-A board 130a. The control processor 132 of server/Ethernet switch-B 130b will be set as "slave" control processor and vice versa.

Figure 6:
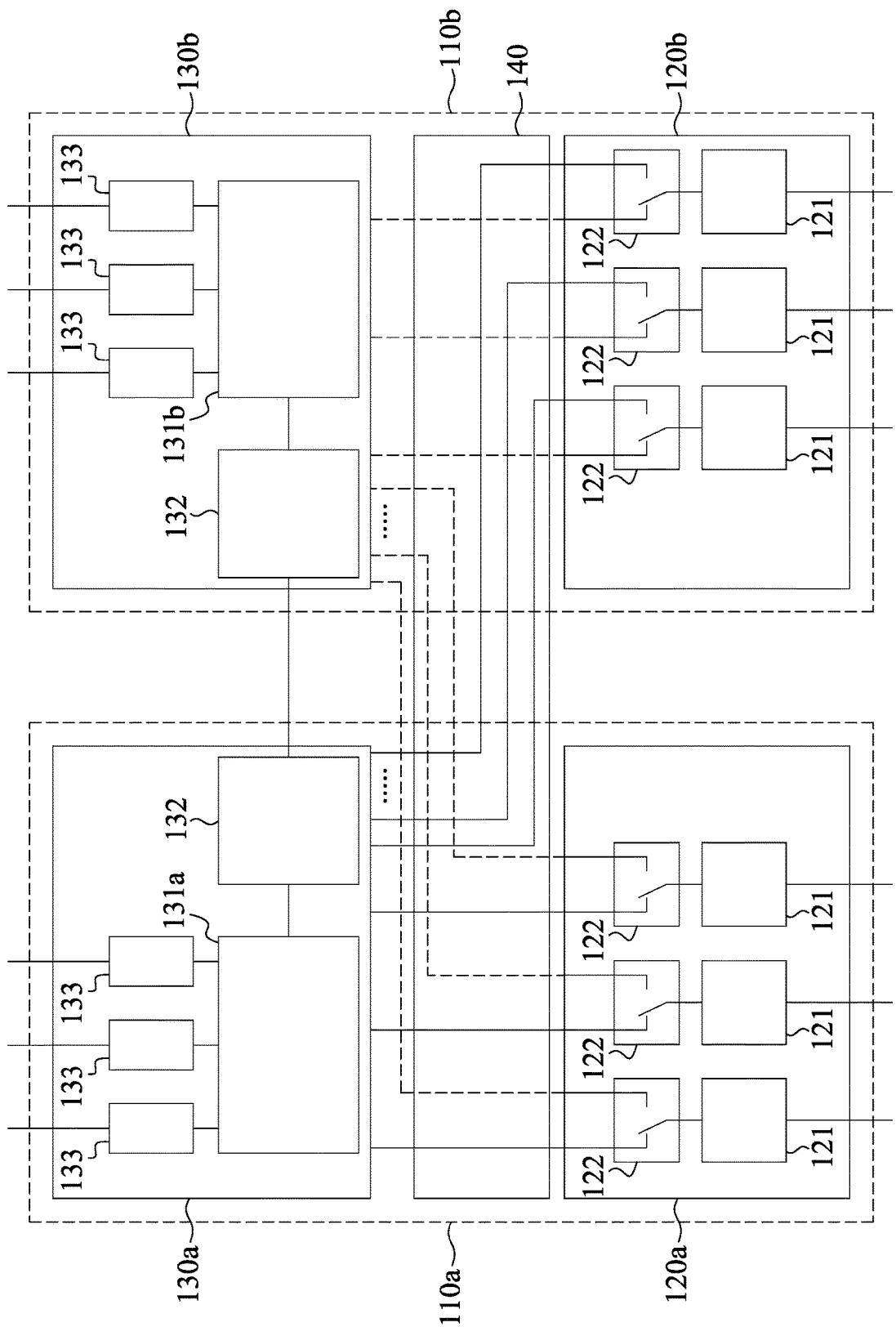
FIG. 6 illustrates a schematic diagram of the operation of the high-speed network switching chips 131a and 131b according to an embodiment of the present application.

In one embodiment, the telco-grade server/Ethernet network switch 100 can support a "one-to-one" protection mode as FIG. 6 illustration. In the "one-to-one" hardware protection usage mode, the traffic from data network or other network send to both server/Ethernet switch-A 110a and server/Ethernet switch-B 110b simultaneously. As server/Ethernet switch-A 110a is set as "master" for the normal channel, the LAN-A port interface board 120a and LAN-B port interface board 120b will connected with server/Ethernet switch-A board 130a. If server/Ethernet switch-A 130a is fail, then both LAN-A port interface board 120a and LAN-B port interface board 120b are be switched to server/Ethernet switch-B board 130b without service interruption.

Figure 7:
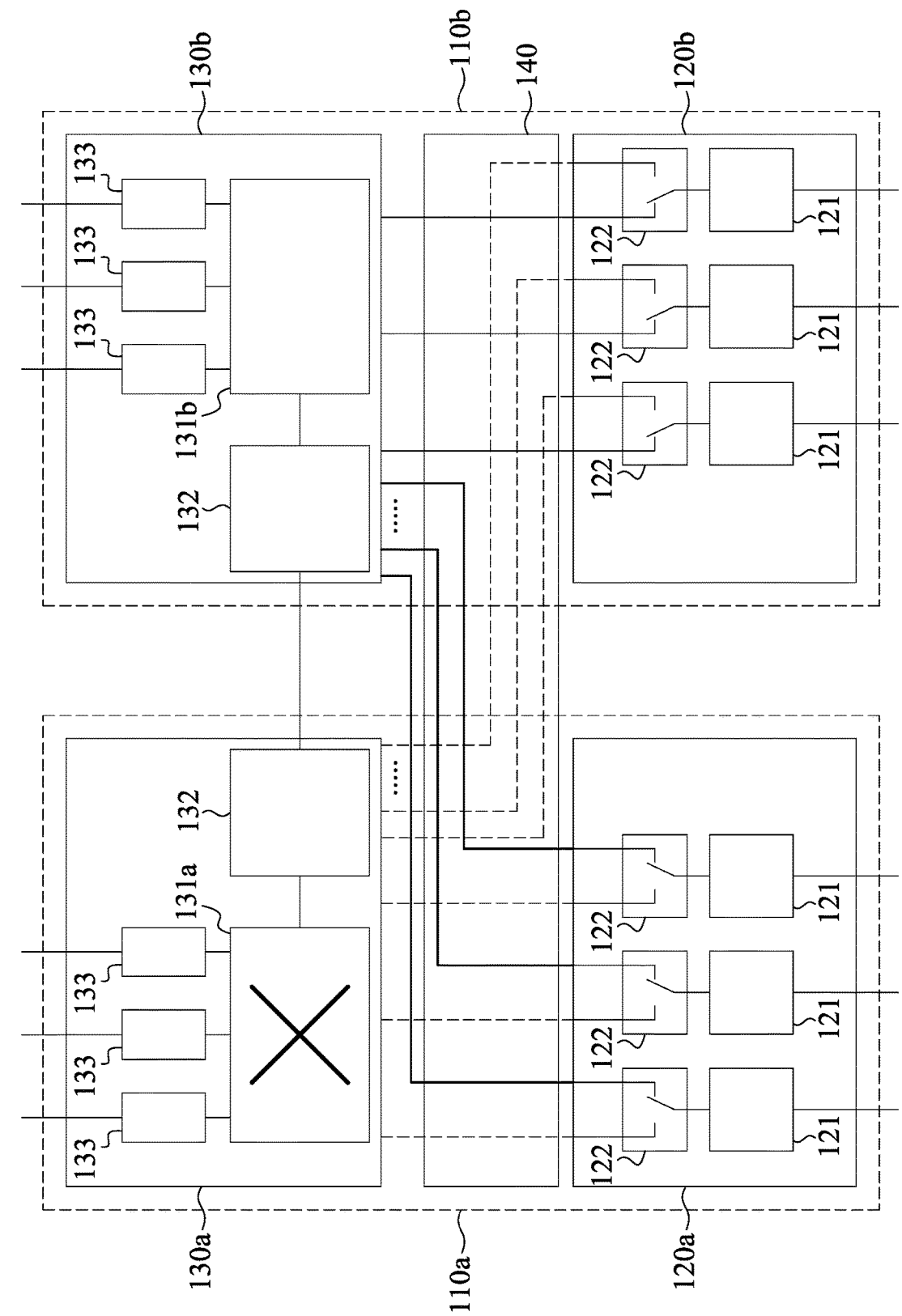
FIG. 7 illustrates a schematic diagram of the telco-grade server/Ethernet network switch 100 can support a "one-plus-one" protection mode.

In one embodiment, the telco-grade server/Ethernet network switch 100 can support a "one-plus-one" protection mode as FIG. 7 illustration. In the "one-plus-one" hardware protection usage mode, the traffic from data network or other network send to server/Ethernet switch-A 110a and server/Ethernet switch-B 110b separately. The server/Ethernet switch-A 110a is set as "master" for the normal service, the traffic is handled by the server/Ethernet switch-A 110a. While server/Ethernet switch-B 110b is set as "slave" for normal service, the traffic is handled by the server/Ethernet switch-B 110b. If the server/Ethernet switch-A board 130a is fail, the LAN-A port interface board 120a will be switched to server/Ethernet switch-B board 130b for continuous traffic service, and vice versa. Note: bandwidth sharing is happened.

In one embodiment, the optical transceiver 121 of LAN port interface board 120a and 120b is a 10 Gb/25 Gb physical layer interface with IEEE1588v2 accrue timing synchronization function and multi-layer network protocol mode. At the same time the optical transceiver digital diagnostic monitor (DDM) can be read to controller by the I²C interface, those parameters include transceiver internal temperature, power supply voltage, TX optical power, TX bias current and RX optical power. Control process 132 collect those message to handle transmission path for the hardware protection.

Figure 8:
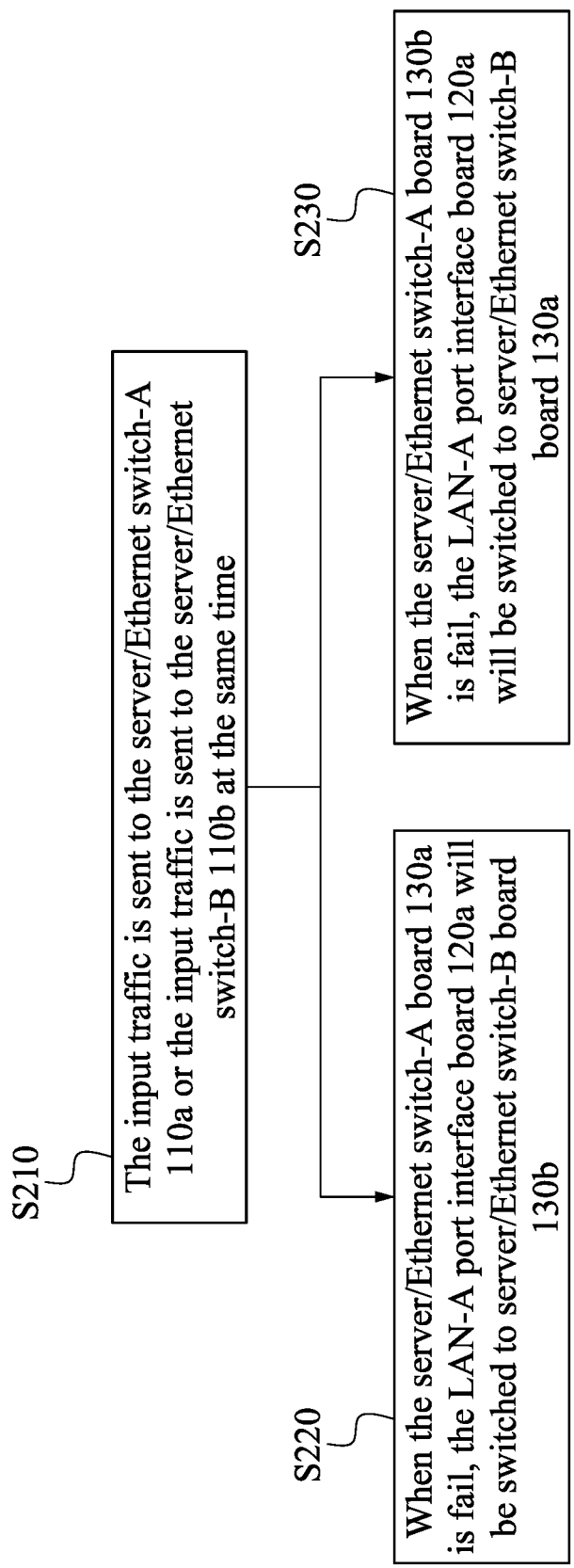
FIG. 8 illustrates a flowchart of an operation method 200 according to an embodiment of the present application.

FIG. 8 illustrates a flowchart of an operation method 200 according to an embodiment of the present application. Please refer to FIG. 3 to FIG. 7. The operation method 200 includes step S210, and step S230. In step S210, the input traffic is sent to the server/Ethernet switch-A 110a or server/

Ethernet switch-B 110*b*. In step S220, when the server/Ethernet switch-A board 130*a* is fail, the LAN-A port interface board 120*a* will be switched to server/Ethernet switch-B board 130*b*, and vice versa.

In summary, with most compact and telco-grade circuit design, the telco-grade server/Ethernet network switch can support high reliability network request, especially the access network in the telco or mobile network operator.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A telco-grade server/Ethernet network switch, comprising:
    a chassis with a high-speed backplane, wherein a height of the chassis is 2 U or 1.5 U; and
    a server/Ethernet switch-A and a server/Ethernet switch-B arranged in the chassis, wherein both the server/Ethernet switch-A and switch-B have same function, and can be set as two independent switches or a telco-grade server/Ethernet network switch with protective switch function,
    wherein the server/Ethernet switch-A further includes a LAN-A port interface board and a server/Ethernet switch-A board connected with the LAN-A port interface board through the high-speed backplane, and the server/Ethernet switch-B further comprises a LAN-B port interface board and a server/Ethernet switch-B board connected with the LAN-B port interface board through the high-speed backplane,
    wherein each of the LAN-A port interface board and the LAN-B port interface board includes a low-speed optical transceiver and a transmission pater selector,
    wherein when the server/Ethernet switch-A is fail, the LAN-A port interface board is switched to the server/Ethernet switch-B board.

2. The telco-grade server/Ethernet network switch of claim 1, wherein an intra-connection between two center processors and a CPU is a PCIe bus or a 1/10 Gbps bus.

3. The telco-grade server/Ethernet network switch of claim 1, wherein a "one-to-one" hardware protection usage mode, a traffic from data network or other network is sent to both the server/Ethernet switch-A and the server/Ethernet switch-B simultaneously, wherein the server/Ethernet switch-A is set as "master" for a normal channel, and the LAN-A port interface board and the LAN-B port interface board will connected with the server/Ethernet switch-A board through the high-speed backplane.

4. The telco-grade server/Ethernet network switch of claim 1, wherein in a "one-plus-one" hardware protection usage mode, a traffic from data network or other network is sent to the server/Ethernet switch-A and the server/Ethernet switch-B separately,
    wherein the server/Ethernet switch-A is set as "master" for a normal service, the traffic is handled by the server/Ethernet switch-A while the server/Ethernet switch-B is set as "slave" for the normal service, the traffic is handled by the server/Ethernet switch B.

5. The telco-grade server/Ethernet network switch of claim 1, wherein parameters of an optical transceiver digital diagnostic monitor (DDM) can be read to a controller by an I$^2$C interface, parameters include transceiver internal temperature, power supply voltage, TX optical power, TX bias current and RX optical power.

6. The telco-grade server/Ethernet network switch of claim 1, wherein when one port of an Ethernet switch fabric of the server/Ethernet switch-A board is fail, the low-speed optical transceiver of the LAN-A port interface board will be switched to an Ethernet switch fabric of the server/Ethernet switch-B without service interruption, and
    wherein when one port of an Ethernet switch fabric of the server/Ethernet switch-B board is fail, the low-speed optical transceiver of the LAN-B port interface board will be switched to an Ethernet switch fabric of the server/Ethernet switch-A.

7. The telco-grade server/Ethernet network switch of claim 1, wherein future comprising an analog input and output interface for monitoring and controlling.

8. The telco-grade server/Ethernet network switch of claim 1, wherein a failover switching time of hardware protection is under 1 million second.

9. The telco-grade server/Ethernet network switch of claim 1, wherein a reliability is 99.999%.

* * * * *